United States Patent [19]

Baker et al.

[11] 4,227,070
[45] Oct. 7, 1980

[54] ELECTRICAL TOTALIZER

[76] Inventors: Thomas E. Baker, 9781 La Zapatilla Cir., Fountain Valley, Calif. 92708; John P. Robertson, 2307 Aralia St., Newport Beach, Calif. 92660

[21] Appl. No.: 901,138

[22] Filed: Apr. 28, 1978

[51] Int. Cl.² ............................................. G06M 3/08
[52] U.S. Cl. .......................... 235/92 ST; 235/92 MT
[58] Field of Search ........ 235/92 ST, 92 EL, 92 MT; 360/6; 346/14 MR, 14 R

[56] References Cited

U.S. PATENT DOCUMENTS

| | | | |
|---|---|---|---|
| 3,803,497 | 4/1974 | Tyau | 235/92 ST |
| 4,007,358 | 2/1977 | Iguchi et al. | 235/92 ST |
| 4,011,509 | 3/1977 | Edwards | 235/92 CA |

OTHER PUBLICATIONS

Instruction Manual GEH-1050F, Type MD Totalizers, General Electric, May 1969, pp. 1-19.
Instruction Manual GEH-2784A, Type SST-3, Solid State Totalizer, General Electric, Apr. 1973, pp. 1-34.

*Primary Examiner*—Joseph M. Thesz
*Attorney, Agent, or Firm*—Christie, Parker & Hale

[57] ABSTRACT

An electrical totalizer for forming an output signal with occurrences separated by a minimum time interval and representative of the total number of random occurrences in first and second circuits. First and second input circuits receive occurrences from, respectively, such first and second circuits. First and second bistable state circuits respond to separate strobes for changing states for each occurrence at, respectively, the first and second input circuits. A combining circuit is coupled to the first and second bistable state circuits for forming an output representation for each different occurrence at the input circuits. A separator forms, in an output signal, an output occurrence responsive to an applied strobe for each of the output representations. A strobing circuit is operative during repetitive cycles for applying, during each cycle, a strobe to each of the first and second bistable state circuits and to the separator in a predetermined sequence.

15 Claims, 5 Drawing Figures

Fig. 4

ELECTRICAL TOTALIZER

BACKGROUND OF THE INVENTION

This invention relates to electrical totalizers and more particularly to totalizers which combine pulses representing power being consumed from two or more different sources and provide output pulses representative of the total power consumed.

Pulse devices are used in watthour and varhour meters by power companies and industry to provide pulses, the number of which is proportional to the power being consumed. The pulses are used for billing purposes as well as for load management programs. The power companies record signals representing the power consumed for subsequent billing to the customer. Billing is made according to the peak energy used during some finite time interval, i.e., 15 minutes, as well as by the time of day that the peak energy usage occurred. Industrial users employ the pulses as input to computers for load management programs.

Where two or more circuits are involved, each circuit carries a separate series of pulses representative of the power being consumed for the corresponding circuit. Totalizers are known which totalize the pulses from separate circuits into a single channel of totalized pulses for purposes of recording. In this regard, the single channel of totalized pulses is commonly recorded on a real time basis on magnetic tape in the form of non return to zero (NRZ) recording. Each transition in flux on the magnetic tape represents a unit of power consumed. The recorded pulses are later utilized to determine the peak power consumption during any desired time interval during the day. It is a characteristic of this type of recording equipment that there be some predetermined minimum time interval between two successive flux changes or pulses recorded along the tape. The problem of totalizing is complicated by the fact that the pulses in one circuit may occur simultaneously, overlap, or occur at most any time separation in relation to the pulses in the other circuit. Also, there may be bursts of power usage where two pulses in one circuit may occur very close together.

Totalizers are known for totalizing multiple circuits of power pulses into a single channel of pulses for recording on tape. One general type of totalizer of this type now in use is referred to as the MD totalizer manufactured by The General Electric Company and described in General Electric brochure GEH-1050F published May, 1969. The MD type totalizer utilizes synchronous motors driving a differential drive gear assembly. Another type of device manufactured by The General Electric Company is referred to as the type SST-3 Solid state Totalizer and is described in General Electric brochure GEH-2784A, published April, 1973.

These prior art types of totalizers suffer from a number of disadvantages.

SUMMARY OF THE INVENTION

Briefly, an embodiment of the present invention involves an electrical totalizer for forming output occurrences, such as changes in signals, which are separated by a minimum time interval. The occurrences are representative of first and second randomly applied occurrences such as the power pulses. The totalizer includes first and second input circuits for receiving, respectively, the first and second occurrences. First and second bistable state circuits are provided for responding to separate strobes for changing states for each occurrence at, respectively, the first and second input circuits. A combining circuit is coupled to the first and second bistable state circuits for forming an output representation for each different occurrence at both input circuits. A separator forms one of the output occurrences, responsive to an applied strobe, for each of the output representations. The strobes are repetitively and sequentially applied, a strobe being applied to each of the first and second bistable state circuits and to the separator sequentially during each repetition.

An embodiment of the present invention is also an electrical totalizer for forming an output signal with random occurrences at a maximum rate of occurrence and representative of the total number of random occurrences separately applied at first and second input circuits. Included are means for sequentially and alternately scanning the first and second input circuits at a first rate and for producing a series of output representations. An output representation is formed for each different occurrence applied at either of the first and second input circuits. Means provides in an output signal a series of output occurrences occurring at a maximum of a second rate. The first rate is twice that of the second rate. One output occurrence is provided for each of the output representations. Means temporarily stores a representation of one of the output representations until an output occurrence has been formed for the output representation preceding such one of the output representations. The means for providing output signals is characterized for providing an output occurrence in the series corresponding to the temporarily stored representation, thereby enabling output occurrences to be reliably formed corresponding to all applied random occurrences. The applied random occurrences have a combined average rate of occurrence of up to the second rate which applied occurrences may be applied at either of the first and second input circuits with an average rate of up to the second rate.

A number of advantages over the above mentioned prior art totalizers may be achieved in such an embodiment of the present invention. These are, by way of example, as follows:

Output occurrences in the order of 900 to 1500 occurrences during a 15 minute period can easily be achieved with the present invention, whereas this is not possible with the MD type totalizer.

The output rate at which pulses are formed by a totalizer is generally limited to some maximum rate by, for example, the recording rate of the recording device. The rate at which input occurrences are provided must be selected so that the totalized occurrences on all input circuits do not exceed that maximum output rate. The present invention will allow a single input circuit (and any input circuit) to accept the full maximum output rate, whereas the MD type device cannot. This is important when energy consumption drops at one input circuit and increases on another.

The present invention will operate properly even though one of the input circuits is inactive (i.e., no occurrences are formed thereat). The operation of the MD type device is adversely affected under these conditions.

The present invention will accept a two occurrence burst rate which is twice as fast as the maximum output rate for the totalizer. Neither the MD nor the SST type totalizer will accurately totalize under these conditions.

The present invention may be easily cascaded in the field for more than two input circuit use without the need for appreciable additional cabinet space, merely by the addition of a circuit board. The MD5 requires the addition of a bulky motor driven differential system and the SST type totalizer is not easily modified in the field to increase the number of input circuits.

The present invention may be cascaded without care being given to the distribution of load among the various input circuits. By way of contrast, the SST type device requires the input circuits receiving occurrences at a higher rate to be connected to lower numbered inputs.

Significantly the present invention is much simpler and is therefore expected to have a much lower failure rate then the SST type device. Because of its simplicity, the present invention requires less space than either the MD or SST type of device.

The present invention may be made much simpler and less costly then either of the aforementioned prior art devices, the same circuit being usable for both two circuit and more than two circuit jobs. Its simplicity also allows for easier technician training.

The present invention is significant in that it is substantially simplified but yet has increased performance characteristics as compared with either the MD device or the SST device.

The separator circuit allows the scan rate or strobe of both bistable state circuits, taken together, to be twice as fast as the scan rate or strobe for the separator circuit thereby allowing any one of the individual input circuits to receive up to the full input design rate for both input circuits of the totalizer. Additionally the separator circuit allows a burst of two successive occurrences at different input circuits which occur at a higher rate than the output rate to be retained and output. This is accomplished with an arrangement wherein the second of the two occurrences in the burst stored and retained are then output at the output rate determined by the strobe.

BRIEF DESCRIPTION OF THE DRAWINGS

FIGS. 4 and 5 are timing diagrams for illustrating the operation of the electrical totalizers of FIGS. 1, 2 and 3.

DETAILED DESCRIPTION

Figure 1:
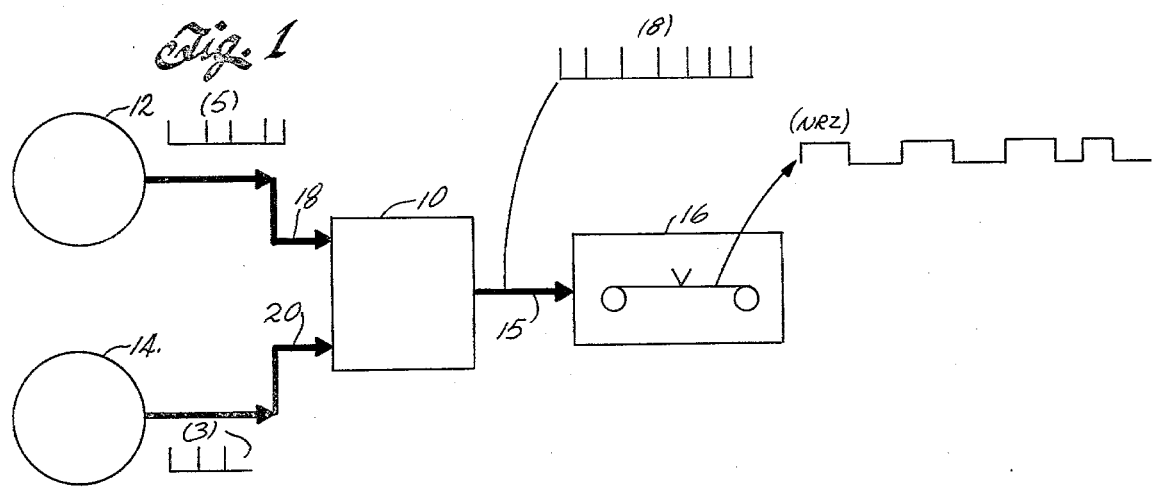
FIG. 1 is a block diagram of a system employing an electrical totalizer for recording pulses on magnetic tape representing pulses from two separate circuits and embodying the present invention.

Refer now to the block diagram of FIG. 1. A totalizer circuit 10 according to the present invention has its two inputs connected to a two wire circuit coming from watt-hour meters 12 and 14. The output of the totalizer is connected to the input of a magnetic tape recorder 16. Generally speaking, each of the watt-hour meters 12 and 14 forms a series of output pulses as indicated. On a real time basis the pulses occur in time so as to represent the actual rate of power consumption and each pulse represents some preselected unit of power consumption. The pulses are applied to the inputs 18 and 20 of the totalizer 10 which in turn combines the pulses, from the separate circuits, to form a series of output pulses at output 15. The total number of output pulses from the totalizer 10 is either equal to or, to be explained, by the use of a divider is proportional to the total number of input pulses received from each of the two watt-hour meters 12 and 14. Thus, 5 input pulses are depicted at input 18 and 3 input pulses are depicted at input 20 whereas a total of 8 output pulses are indicated at output 15. The tape recorder 16 saturates the magnetic tape in one direction for one pulse at output 15 and in the opposite direction for the next sequential pulse at output 15, i.e, NRZ recording. This occurs in real time so that the pulses along the magnetic tape can be read back to determine the total power consumed during any particular time period such as the above mentioned 15 minute time interval.

Figure 2:
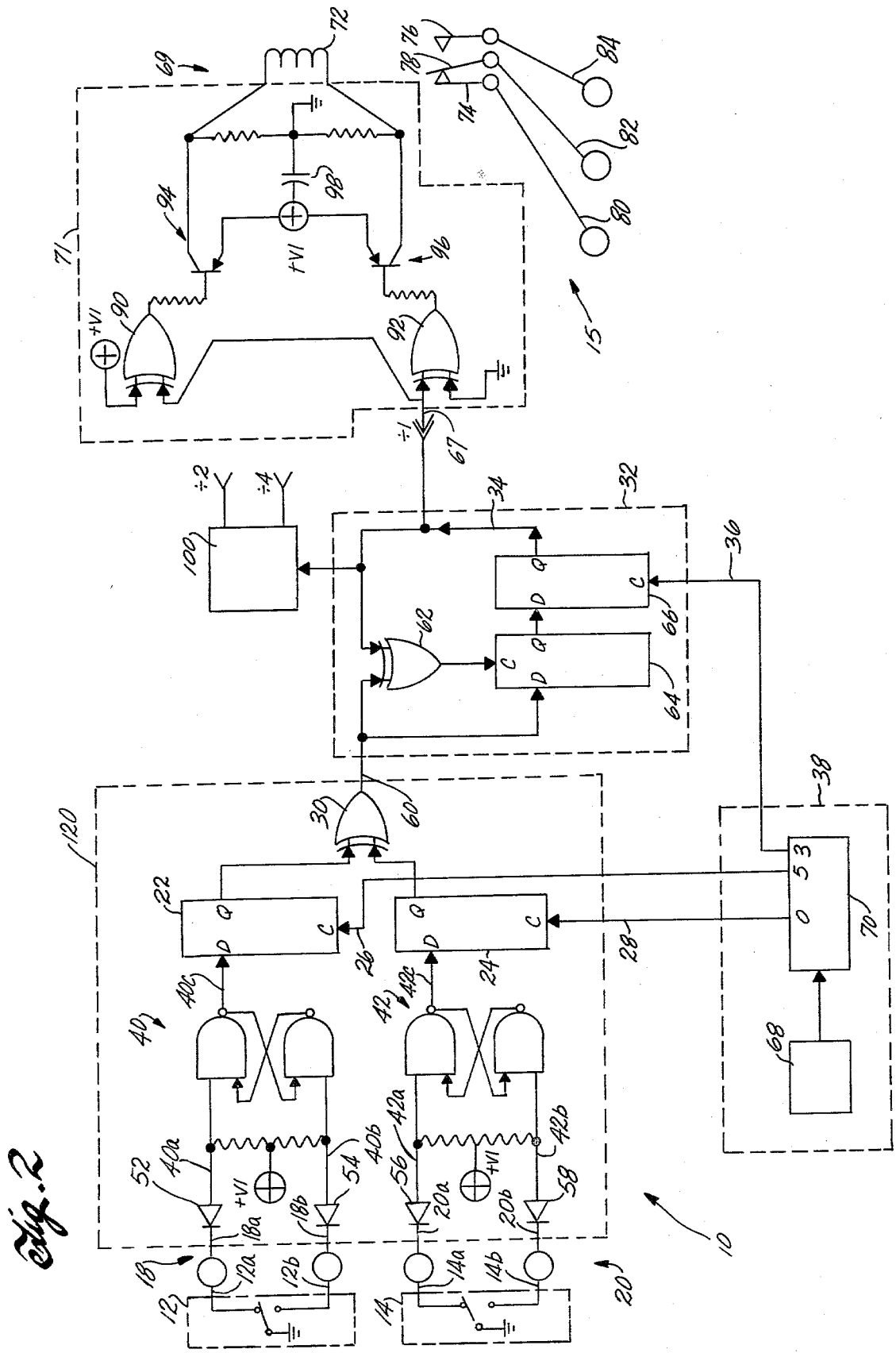
FIG. 2 is a schematic diagram of an electrical totalizer and depicting the contacts of the watt-hour meters and embodying the present invention.

Refer now to the schematic diagram of the electrical totalizer 10 depicted in FIG. 2. For purposes of illustration the circuitry for forming the pulses in each of the watt-hour meters 12 and 14 is depicted at the left hand side of FIG. 1 in dot dash line. The electrical totalizer 10 includes all of the circuitry of FIG. 2 except for that depicted in the dot dash lines. Each of the watt-hour meters includes a set of mercury wetted relay contacts which alternately apply ground to two conductors of an output circuit. For example, watt-hour meter 12 has output conductors 12a and 12b and watt-hour meter 14 has output conductors 14a and 14b. Each time a relay contact connects ground to a different one of the conductors 12a and 12b, a pulse is formed representing another unit of power consumption. Similar comments apply to the conductors 14a and 14b of watt-hour meter 14. Whenever a unit of power is consumed and a relay contact switches ground to a different conductor, a pulse or occurrence in the input signal is said to occur.

Briefly, electrical totalizer 10 of FIG. 2 forms an output signal at conductor 34 with changes in signal, separated by a minimum time interval. Each change in signal on conductor 34 is also referred to as an occurrence. These occurrences are re-formed and represented as occurrences in the form of contact closures at the output 15 as will be described in more detail hereinafter. The occurrences in the output signal on conductor 34 are separated by a minimum time interval and represent the total number of random occurrences provided by the watt-hour circuits 12 and 14 and the rate at which the total of the input occurrences appear in time. The electrical totalizer 10 has first and second input circuits 18 and 20 for receiving the occurrences from the watt-hour meters 12 and 14, respectively. The first and second bistable state circuits 22 and 24 respond to separate strobes for changing states for each occurrence at, respectively, the input circuits 18 and 20. Thus, bistable state circuit 22 changes state, responsive to a strobe applied on conductor 26, for each occurrence at the input 18. Similar comments apply as to the bistable state circuit 24 with respect to input circuit 20 when a strobe is applied on conductor 28.

Combining means in the form of an exclusive OR gate 30 is coupled to the bistable state circuits 22 and 24 for forming a different one of two output signals, or output representations, for each different occurrence at the input circuits 18 and 20. Separator means in the form of circuit 32 forms an output signal at conductor 34. The separator circuit 32 forms an output occurrence in the output signal at conductor 34 responsive to a strobe applied at conductor 36 for each of the different output representations from the exclusive OR gate 30.

Means in the form of a clock 38 is operative during repetitive cycles for applying, during each cycle, a strobe to each of the bistable state circuits 22 and 24 and to the separator circuit 32 (via conductors 26, 28 and 36). The strobes are applied on the conductors 26, 28 and 36 one after the other in a predetermined sequence as will be explained in more detail hereinafter.

Consider the electrical totalizer circuit 10 in more detail. The bistable state circuit 22 is coupled to input conductors 18a and 18b, forming the input circuit 18 through an RS type flip flop 40. Similarly, the bistable state circuit 24 is connected to conductors 20a and 20b, forming the input circuit 20, through an RS flip flop 42. The RS flip flop is a signal conditioning circuit that eliminates contact bounce and contact transition problems inherently present in the contacts in the watt-hour meters. The RS flip flop 40 has inputs 40a and 40b and an output 40c. The RS flip flop is formed of two crosscoupled and latching AND gates and is characterized in that it will trigger to one of two states depending on the input which is connected to ground, i.e., grounded. For example, when ground is connected to input 40a, RS flip flop 40 goes to one state, whereas when input 40b is grounded, it goes to the other state. When RS flip flop 40 is in one state called the "1" state, the output 40c receives what is referred to as a "1" signal, whereas when RS flip flop 40 is in its other state, called the "0" state, the output 40c receives what is referred to as the "0" signal. Such RS flip flops as well known in the art.

The inputs to the RS flip flops 40 and 42 are made more immune to spurious signals by the provision of diodes 52, 54, 56 and 58. It should now be evident that the RS flip flops will alternately trigger from one state to the other each time the relay contacts in the corresponding watt-hour meter 12 changes the ground connection from one of the conductors to the other at the corresponding input circuit.

The bistable state circuits 22 and 24 are D-type flip flops. The D-type flip flops are well known in the digital art and are characterized in that a signal referred to herein as the "1" signal at the "0" input will cause the flip flop to (1) form a "1" signal at the "Q" output and (2) cause the flip flop to change to what is referred to herein as a "1" state immediately upon the occurrence of a strobe signal (to be defined) at the "C" input. Similarly, the D-type flip flop is characterized in that a signal referred to herein as the "0" signal at the "D" input will cause the flip flop to (1) form a "0" signal at the "Q" output and (2) cause the flip flop to change to what is referred to herein as a "0" state immediately upon the occurrence of a strobe signal at the "C" input. "1" and "0" signals are complementary, i.e., one a high voltage and the other a relatively lower voltage in relation to the first. The strobe is a signal which makes a rapid transition from a low level of voltage to a relatively higher value. These voltage values are only used by way of example.

To be explained in more detail, the flip flops 22 and 24 alternately receive strobes at the "C" inputs on conductors 26 and 28 and as a result allow for a time separation when simultaneous occurrences occur at the two inputs 18 and 20.

The "Q" outputs of bistable state circuits 22 and 24 are connected to the input of the exclusive OR gate 30. Significantly, the OR gate 30 sums up the occurrences applied at the two inputs 18 and 20 and forms an output signal representing the total of the occurrences. The exclusive OR gate 30 is characterized in that it forms an output signal at conductor 60 representing a "1" whenever the bistable state circuits 22 and 24 are in different states. Thus a "1" output is formed by OR gate 30 when bistable state circuits 22 and 24 are in "0" and "1" or in "1" and "0" states, respectively. If both of bistable state circuits 22 and 24 are in a "0" or "1" state, exclusive OR gate 30 forms a "0" output.

Refer now to the burst separator circuit 32. The burst separator circuit 32 includes exclusive OR gate 62 (which is identical to exclusive OR gate 30) and bistable state circuits 64 and 66. Bistable state circuits 64 and 66 are both D-type flip flops having identical characteristics to that described hereinabove with respect to circuits 22 and 24.

Briefly, exclusive OR gate 62 applies a strobe signal to the "C" input of bistable state circuit 64, causing it to store a signal, i.e., assume a state, corresponding to the output from exclusive OR gate 30. Bistable state circuit 66 has its "D" input connected to the "Q" output of bistable state circuit 64 and has its "C" input connected to conductor 36 from the output of the clock circuit 38. The "Q" output of flip flop 66 is connected to conductor 34 and to one of the inputs to exclusive OR gate 62.

The clock circuit 38 includes a constant frequency oscillator 68 which applies its clock pulse signals to a decade counter 70. The decade counter 70 has ten sequential states referred to as 0,1,2,3,4, 5 through 9. At states 0, 3 and 5, respectively, a clock or strobe pulse is applied, respectively, to the conductors 28, 36 and 26. The leading edge of the pulse is a positive transition which forms the strobe for the corresponding bistable state circuits.

From the foregoing description it should be evident that the rate at which the strobe circuit 38 strobes both of the bistable state circuits 22 and 24 is twice the rate at which the bistable state circuit 66 is strobed. Stating it differently, a strobe is applied to each of the bistable state circuits 22 and 24 once before a strobe is applied to the bistable state circuit 66.

Briefly, FIG. 2 discloses an electrical totalizer for forming an output signal with random occurrences at a maximum rate of occurrence and representative of the total of random occurrences separately applied at the first and second input circuits 18 and 20. Included is a circuit 120 which sequentially and alternately scans the first and second input circuits at a first rate, determined by the clock 70, and produces a series of output representations at 60. An output representation is formed at 60 for each different occurrence applied at either of the input circuits 18 and 20. The separator circuit 32 forms a means for providing in an output signal a series of output occurrences at a maximum of a second rate. The output signal is formed at conductor 34. A first rate (i.e., pulses applied at the 0 and 5 output of counter 70) is twice that of the second rate (i.e., the rate at which pulses are formed at the 3 output of counter 70). One output occurrence is formed at conductor 34 for each of the output representations formed at conductor 60. Bistable state circuit 64 forms means for temporarily storing a representation of one of the output representations (formed at conductor 60) until an output occurrence has been formed at conductor 34 for the output representation which precedes such one of the output representations. The separator circuit 32 is characterized for providing an output occurrence in the series corresponding to the temporarily stored representation. As a result, output occurrences are reliably formed corresponding to all applied random occurrences where the applied random occurrences have a combined average rate of occurrence of up to the second rate. Additionally, the applied occurrences may be applied at either of the input circuits 18 and 20 with an average rate of up to the second rate.

Figure 4:
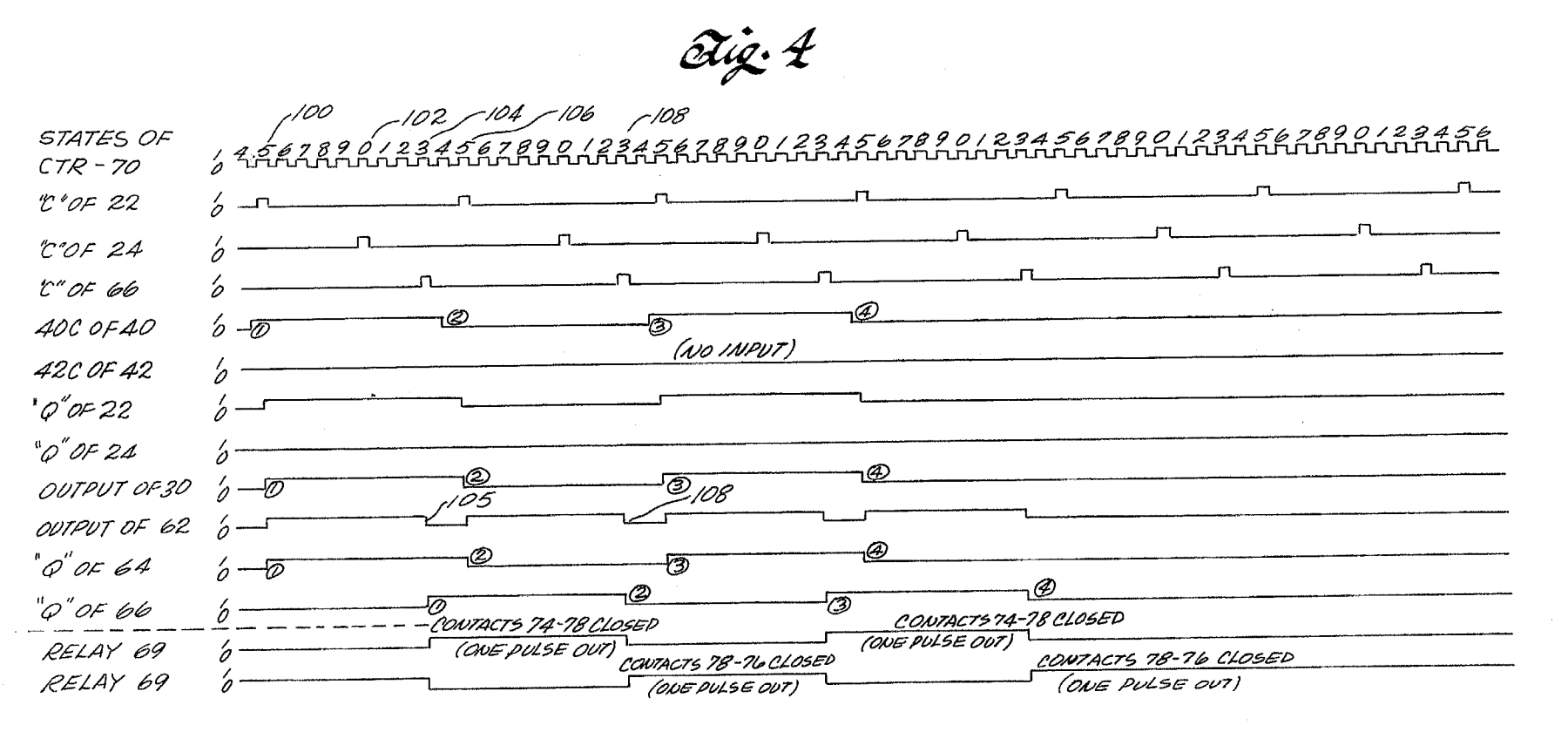

Consider an example of the operation of the totalizer circuit of FIG. 1 with reference to the timing diagram of FIG. 4. FIG. 4 depicts the states of the counter 70, the strobe applied to the "C" input of flip flops 22, 24 and 66, and the signals formed at the outputs 40c and 42c of the RS flip flops 40 and 42, the "Q" outputs of the flip flops 22 and 24, 64 and 66, and the outputs of the exclusive OR gates 30 and 62. The ten states 0–9 of the counter 70 are numbered across the top of FIG. 4 adjacent the corresponding waveform. FIG. 4 assumes that the relay contact in watt-hour meter 12 alternates between the conductors 12a and 12b and that the relay countact in watt-hour meter 14 does not change. As a result, a series of four changes in signal or occurrences are formed at the output 40c of the RS flip flop 40 and FIG. 4 identifies the four occurrences at "40c of 40" by the numerals 1 through 4 with a circle surrounding the number (referred to hereinafter as "in circle").

Occurrence 1 in circle results in a "1" state of RS flip flop 40. When the counter 70 reaches the state 5, which is identified in FIG. 4 as 100, the strobe applied at the "C" input of bistable state circuit 22 causes it to change from state "0" to state "1". With bistable state circuit 22 in state "1" it is assumed that bistable state circuit 24 is in state "0". Thus, exclusive OR gate 30 forms a "1" output or representation. The "1" output of exclusive OR gate 30 represents the 1 "in circle" occurrence provided by the watt-hour meter 12.

It is also assumed that the bistable state circuit 66 is in a "0" state. Thus, exclusive OR gate 62 receives a "1" input from exclusive OR gate 30 and a "0" input from bistable state circuit 66, causing the exclusive OR gate 62 to go from a "0" to a "1" at its output. The positive transition at the output of exclusive OR gate 62 forms a strobe for the "C" input of bistable state circuit 64, causing it to change from a "0" to a "1" state. Bistable state circuit 64 now stores a value corresponding to the occurrence 1 "in circle".

At counter state "0", designated 102 in FIG. 4, a strobe is applied to the bistable state circuit 24. However, since it is assumed that no occurrences are being applied by the watt-hour meter 14, bistable state circuit 24 remains in a "0" state.

At counter state 3, designated 104 in FIG. 4, a strobe is applied at the "C" input of bistable state circuit 66. Since bistable state circuit 64 is in a "1" state, the bistable state circuit 66 is triggered to a "1" state. As designated by the 1 "in circle" in FIG. 4, pulse 1 from watt-hour meter 12 has now resulted in an occurrence on conductor 34 at the "Q" output of bistable state circuit 66.

The "1" output formed at the "Q" output of bistable state circuit 66 in combination with the "1" output of exclusive OR gate 30 causes the output of exclusive OR gate 62 to go from "1" to "0", as depicted at 105 in FIG. 4, conditioning exclusive OR gate 62 so that the next change in the output of exclusive OR gate 30 will cause it to apply a strobe to the "C" input of bistable state circuit 64.

The position of the relay contacts in watt-hour meter 12 changes and causes the signal at output 40c of the RS flip flop 40 to change to a "0", creating occurrence 2 "in circle". Counter state 5, designated 106 in FIG. 4, causes a strobe at the "C" input of bistable state circuit 22 and the bistable state circuit 22 is reset to a "0" state. Since bistable state circuit 24 is already in a "0" state, the newly formed "0" state of bistable state circuit 22 causes the exclusive OR gate 30 to in turn form a "0" output. The "0" output of exclusive OR gate 30 in combination with the "1" state of bistable state circuit 66 causes the exclusive OR gate 62 to change its output from a "0" to a "1". The positive transition at the output of exclusive OR gate 62 forms a strobe at the input of bistable state circuit 64 causing it to assume a "0" state corresponding to the "0" output of exclusive OR gate 30. Thus, bistable state circuit 64 now stores a value corresponding to the occurrence 2 "in circle".

Subsequently, counter state 3, designated 108 in FIG. 4, is reached and a strobe is applied at the "C" input of bistable state circuit 66. This causes the bistable state circuit 66 to assume a "0" state corresponding to the state of bistable state circuit 64 and as a result a "0" output is formed on conductor 34 at the "Q" output of bistable state circuit 66, representing the occurrence 2 in circle.

The "0" output formed at the "Q" output of bistable state circuit 66 in combination with the "0" output of exclusive OR gate 30 causes the output of exclusive OR gate 62 to go from a "1" to a "0" as depicted at 108 in FIG. 4, again conditioning the exclusive OR gate 62 so that the next change in the output of exclusive OR gate 30 will cause it to apply a strobe to the "C" input of bistable state circuit 64. Similar analysis will apply for subsequent occurrences or pulses 3 "in circle" and 4 "in circle".

Figure 5:
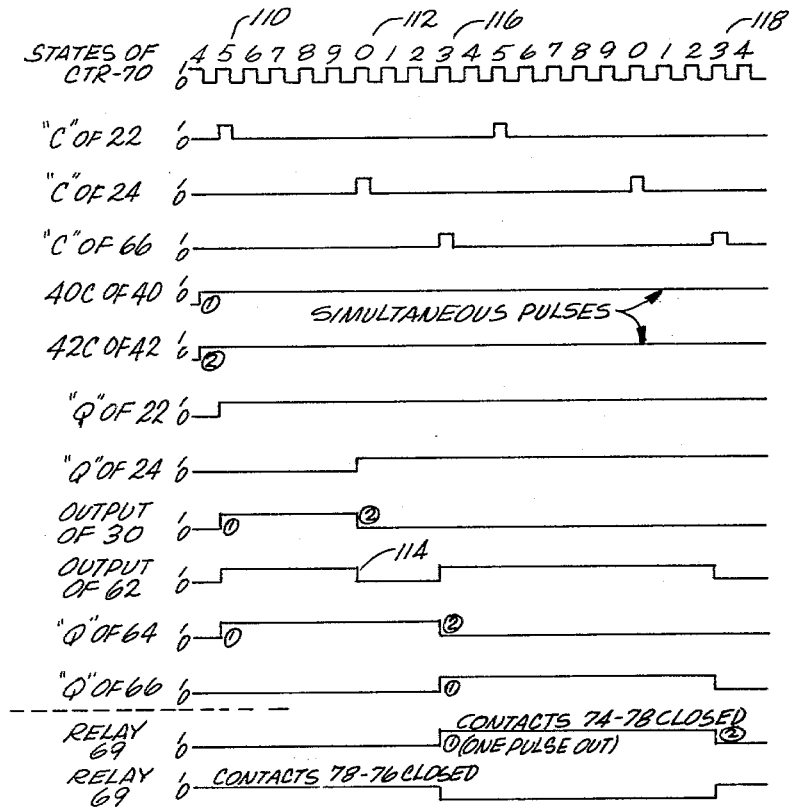

Refer now to FIG. 5 and consider the situation where there are simultaneous occurrences from the two watt-hour meters 12 and 14. Under these conditions it is assumed that both of RS flip flops 40 and 42 go from a "0" to a "1" state and hence "1" signals are formed at both of the outputs 40c and 42c. The occurrences are identified as 1 and 2 in circle. At the following counter state 5, designated 110 in FIG. 4, the "C" input of bistable state circuit 22 receives a strobe, causing bistable state circuit 22 to change from a "0" to a "1" state. The bistable state circuit 24 is in a "0" and accordingly the exclusive OR gate 30, sensing different states in the two bistable state circuits 22 and 24, forms a "1" output representing the occurrence 1 in circle. It is assumed that bistable state circuit 66 is now in a "0" state and accordingly the exclusive OR gate 62, sensing different valued outputs from bistable state circuit 66 and exclusive OR gate 30, changes its output from a "0" to a "1", forming a strobe at the "C" input of bistable state circuit 64. The strobe at the "C" input of bistable state circuit 64 causes it to change to a "1" state corresponding to the output of exclusive OR gate 30. Thus, bistable state circuit 64 now stores a value corresponding to the occurrence 1 in circle.

Subsequently, clock state 0, designated 112 in FIG. 5, causes a strobe at the "C" input of bistable state circuit 24, causing it to change to a "1" state corresponding to the state of bistable state circuit 24. Bistable state circuit 24 now stores a value corresponding to occurrence 2 in circle. Bistable state circuits 22 and 24 are now in the same state, i.e., state "1", causing the exclusive OR gate 30 to form a "0" output corresponding to the occurrence 2 in circle. Since bistable state circuit 66 is still in a "0" state, the two inputs to the exclusive OR gate 62 are alike, causing the exclusive OR gate 62 to change its output from a "1" to a "0" as depicted at 114 in FIG. 5.

Subsequently the clock state 3, designated 116 in FIG. 5, causes a strobe at the "C" input of bistable state circuit 66. The strobe causes bistable state circuit 66 to be triggered into a "1" state corresponding to the "1" state of bistable state circuit 64. As a result the occurrence 1 "in circle" 40c has now caused an output occurrence on conductor 34 at the "Q" output of bistable state circuit 66 as indicated by 1 "in circle".

In addition the bistable state circuit 66 is now storing a "1" and the exclusive OR gate 30 is now forming a "0" output, causing the exclusive OR gate 62 to apply a strobe to bistable state circuit 64, causing it to change to a "0" state corresponding to the "0" output of exclusive OR gate 30. Bistable state circuit 64 now stores a value corresponding to occurrence 2 "in circle".

Subsequently, clock state 3, designated 118 causes a strobe at the "C" input of bistable state circuit 66, causing it to assume a "0" state corresponding to the "0" state of bistable state circuit 64. As a result a "0" value is formed on conductor 34 at the "Q" output of bistable state circuit 66 thereby representing the occurrence 2 "in circle".

In summary then what has been disclosed are two bistable state circuits 22 and 24 each for assuming a different state in response to a strobe for each occurrence in an input signal. A clock 70 is provided for alternately strobing the bistable state circuits 22 and 24 at differing times. Exclusive OR gate 30 alternately forms output indications representing binary "1" and "0" values. A different one of the binary values is formed for each change in state of either one of the bistable state circuits 22 and 24. Bistable state circuit 64 forms a storage circuit which is operative, upon an applied strobe, for storing an indication of a binary value "1" for a binary value "1" output from the exclusive OR gate 30 and is further operative for storing an indication of a binary value "0" for a binary value "0" output from the exclusive OR gate 30. The bistable state circuit 66 forms a means for reading out the stored indications in the bistable state circuit 64, and the clock 70 enables the readout upon the occurrence of the strobe of both the bistable state circuits 22 and 24. The exclusive OR gate 62 forms means for applying a strobe to the bistable state circuit 64 to enable a store to take place therein upon the coincidence of opposite binary values in the output from exclusive OR gate 30 as compared with the indication in bistable state circuit 64 which is last read out by the bistable state circuit 66.

It should now be seen that the bistable state circuit 66 will only read out values from bistable state circuit 64, i.e., form occurrences at the output "Q" on conductor 34, whenever clock 70 reaches state 3. Therefore the occurrences at the conductor 34 cannot occur any closer together than the time for clock 70 to cycle through its complete ten states of operation. As a result the burst separator circuit 32 ensures that no occurrences are formed at the output conductor 34 any closer together than the time for clock 70 to cycle through its ten states of operation.

If it is not required that the pulses formed at output 34 be spaced by some minimum time interval, then the sub combination indicated at 120 in FIG. 2 can be employed. To this end bistable state circuits 22 and 24, exclusive OR gate 30, and clock 70 can be employed for forming a simple totalizer circuit for asynchronous occurrences in input signals occurring at the two input circuits 18 and 20. The bistable state circuits 22 and 24 each form a 2 state circuit which assumes a different state in response to a strobe for each occurrence in the corresponding input signal. The clock 70 alternately strobes the two bistable state circuits 22 and 24 at differing times and at a fixed rate. Exclusive OR gate 30 forms an output indication for each occurrence of a predetermined relation in states between the bistable state circuits 22 and 24. For example, whenever the bistable state circuits 22 and 24 are in different states, the exclusive OR gate 30 forms a "1" output, whereas when the bistable state circuits are in the same state, the exclusive OR gate 30 forms a "0" output.

As discussed with reference to FIG. 1, the eletrical totalizer 10 has its output 15 connected to a magnetic tape recorder 16 which in turn is arranged for recording in NRZ format. Referring to FIG. 2, the output 15 has three output conductors 80, 82 and 84. A connection between conductors 80 and 82 causes the tape recorder 16 to magnetically saturate the tape in one direction whereas a connection between the conductors 82 and 84 causes a magnetic saturation in the opposite direction. The totalizer circuit includes a relay 69 and a relay driver 71. The relay driver 71 receives signals from the conductor 34 causing the relay driver 71 to switch the relay 69 between two states of operation. Specifically the relay 69 has a coil 72 and contacts 74, 76 and 78. The relay driver 71 energizes the coil 72 in one of two directions causing the relay to switch the contact 78 either into electrical contact with contact 74 or contact 76 thereby shorting together conductors 80 and 82 or conductors 82 and 84.

The relay driver 71 has an input conductor 67 connected to the conductor 34. Conductor 67 is connected to one input of each of exclusive OR gates 90 and 92. Exclusive OR gates 90 and 92 are identical to exclusive OR gate 30 described hereinabove. The other input of exclusive OR gate 90 is connected to a ground +V1 source of potential the value of which is equal to the so-called "1" output signal. The exclusive OR gate 92 has its other input connected to ground potential which is the so-called "0" output signal. As a result the outputs of exclusive OR gates 90 and 92 always represent opposite binary values. The binary values represented by the output of exclusive OR gates 90 and 92 switch between values "1" and "0" as the signal on conductor 67 changes between values "1" and "0".

The outputs of exclusive OR gates 90 and 92 are connected through relay driving transistors 94 and 96, respectively, across opposite sides of the coil 72. The exclusive OR gates 90 and 92 and transistors 94 and 96 provide alternate polarity of current through the coil 72 thereby alternately driving the relay contacts 74 and 78 and the contacts 78 and 76 into contact as the signal on conductor 67 alternates between "0" and "1" values. A capacitor 98 is connected between the emitter of transistors 94 and 96 and ground in order to prevent high frequency noise problems.

FIG. 4 depicts the operation of the relay driver 71 and relay 69 with respect to the example given in FIG. 4. For example, when the "Q" output of bistable state circuit 66 represents a "1", relay contacts 74 and 78 are closed, whereas when the output represents a binary "0", relay contacts 78-76 are closed.

Similar comments apply to the example of FIG. 5.

It may be desirable to divide the frequency of the occurrences at conductor 34 to a sub multiple, i.e., divide the occurrences so that only one half as many or one fourth as many occurrences or contact closures are formed at the output 15 as compared with the frequency of occurrences on conductor 34. To this end a divider 100 is provided having an input connected to conductor 34. Divider 100 is a conventional divider circuit made up of type D flip flops which divide the input signals thereto by 2 or 4. Thus the output identified "÷2" upon receipt of a signal which alternates between "1" and "0" divides the frequency of that signal by two. The output labeled "÷4" upon receipt of a signal which alternates between "1" and "0" divides the frequency of that signal by four. In order to divide the frequency of the signal on conductor 34, the conductor 67 is connected to either the ÷2 or the ÷4 output from the divider 100.

Figure 3:
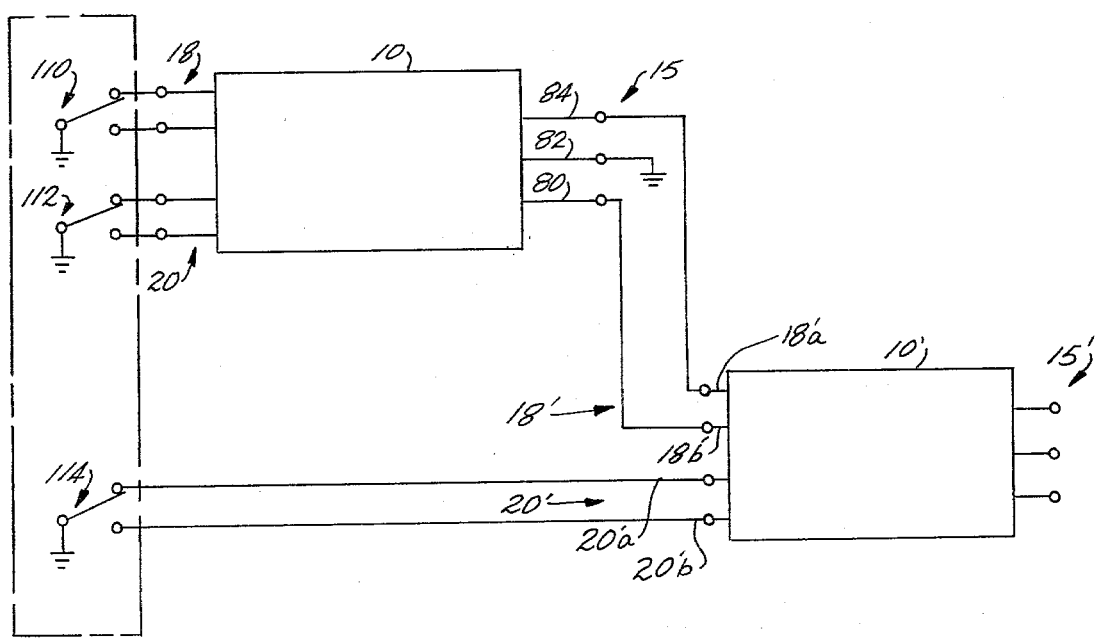
FIG. 3 is a block diagram of an electrical totalizer system for combining pulses from three different circuits and embodying the present invention.

FIG. 3 depicts an alternate embodiment of the invention in which the electrical totalizer circuits 10 are cascaded to accommodate three separate input circuits. In the three separate circuits, mercury wetted watt-hour meter contacts 110, 112 and 114 each provide pulses representing units of power consumed in the same manner described with respect to the watt-hour meters 12 and 14 of FIG. 2. For ease of explanation, one of the electrical totalizer circuits is referred to by the same reference numerals used in FIG. 1 whereas the other uses the same numerals with primes.

Referring in more detail to FIG. 3, the electrical totalizer 10 has its output 15 connected to the input 18' of electrical totalizer 10'. Specifically, conductors 84 and 80 at the output 15 are connected, respectively, to the input conductors 18a' and 18b' of electrical totalizer 10'. Conductor 82 at the output 15 is connected to ground, enabling the corresponding relay contacts 74, 78 and 76 (see FIG. 2) to alternately connect the conductors 84 and 80 to ground. The remaining inputs 18 and 20 of totalizer 10 and input 20' of totalizer 10' are connected to the three separate circuits including the relay contacts 110, 112 and 114 in the same manner described with reference to FIG. 2.

With the cascaded electrical totalizer circuits of FIG. 3, the occurrences formed by relay contacts 110 and 112 are totalized by the totalizer 10, causing a series of occurrences in the signal at the output 15 which are applied to the input of totalizer 10'. The occurrences formed in the output signal at 15 are in turn totalized with the occurrences formed by the relay contacts 114 in the electrical totalizer 10'. The occurrences in the output signal at 15' represent the sum or total of all of the electrical impulses formed by all of the relay contacts 110, 112 and 114. The output 15' may in turn be connected to a tape recorder or other monitoring or recording device in order that the totalized occurrences can be stored or recorded.

It will be apparent that additional electrical totalizer circuits 10 can be cascaded. For example, occurrences on four separate circuits can be totalized merely by adding another electrical totalizer 10 connected to the output of totalizer 10' and by connecting the fourth circuit to the additional totalizer.

Although an exemplary embodiment of the invention has been disclosed for purposes of illustration it will be understood that various changes, modifications and substitutions may be incorporated into such embodiment without departing from the spirit of the invention as defined by the claims appearing hereinafter.

What is claimed:

1. An electrical totalizer for forming an output signal with occurrences separated by a minimum time interval and representative of the total number of random occurrences in first and second circuits, comprising:

first and second input circuits for receiving occurrences from, respectively, such first and second circuits;

first and second bistable state circuits for responding to separate strobes for changing states for each occurrence at, respectively, the first and second input circuits;

combining means coupled to the first and second bistable state circuits for forming an output representation for each different occurrence at both input circuits;

separator means for forming in an output signal an output occurrence responsive to an applied strobe for each of the output representations; and means operative during repetitive cycles for applying, during each cycle, a strobe to each of the first and second bistable state circuits and to the separator means in a predetermined sequence.

2. An electric totalizer according to claim 1 wherein the combining means comprises means for forming output representations which differ from one output representation to the next.

3. An electric totalizer according to claim 1 wherein the combining means comprises exclusive OR gating means.

4. An electric totalizer according to claim 1 wherein, in order, a burst of first and second sequential ones of said output representations are formed, the separator means comprising:

first means for storing, in sequence, first and second representations of, respectively, the first and second output representations and for forming, respectively, first and second output occurrences in the output signal, each of the first and second output occurrences being formed in response to a separate one of the strobes applied to the separator means; and second means responsive to the first output representation for temporarily storing the first representation and for subsequently transferring a representation thereof to the first means for storing and forming output occurrences, the second means being operative upon formation of the first output occurrence for temporarily storing the second representation and for subsequently transferring a representation thereof to the first means for storing and forming output occurrences.

5. An electric totalizer according to claim 1 wherein the separator means comprises means for forming first and second different output signals, a different one being formed to represent each successive output representation, and wherein the separator means comprises storage means for storing first and second different signals corresponding to, respectively, the first and second output signals;

readout means for forming in the output signal an output occurrence responsive to the strobe applied to the separator means for each change in the signals stored in the storage means; and means for enabling the storage means to store upon forming an output occurrence.

6. An electric totalizer according to claim 5 wherein the combining means comprises exclusive OR gating means.

7. An electric totalizer according to claim 5 wherein the means for enabling the storage means comprises exclusive OR gating means having input circuits coupled to the combining means and the readout means.

8. An electric totalizer according to claim 7 wherein the readout means comprises a further storage means.

9. An electric totalizer according to claim 8 wherein the storage means and further storage means each comprises a bistable state circuit.

10. An electric totalizer according to claim 1 wherein the strobe applying means comprises means for applying the first and second strobes with evenly spaced time intervals therebetween.

11. An electric totalizer according to claim 1 wherein the strobe is applied to the separator means at a fixed frequency.

12. An electric totalizer for forming an output signal with occurrences separated by a minimum time interval and representative of the total number of random occurrences in first and second circuits, comprising:
- a first input circuit for receiving such occurrences from the first circuit;
- a second input circuit for receiving such occurrences from the second circuit;
- a first bistable state circuit responsive to a first strobe for changing states for each occurrence at the first input;
- a second bistable state circuit responsive to a second strobe for changing states for each occurrence at the second input;
- means for forming a different output representation upon a predetermined combination of states of the first and second bistable state circuits;
- separator means for forming in an output signal an output occurrence responsive to an applied third strobe for each of the output representations; and
- means operative during repetitive cycles for applying, during each cycle, the first, second and third strobes in a predetermined sequence.

13. An electric totalizer for forming an output signal with occurrences separated by a minimum time interval and representative of the total number of random occurrences in first and second circuits, comprising:
- a first input circuit for receiving occurrences from such first circuit;
- a second input circuit for receiving occurrences from such second circuit;
- a first bistable state circuit responsive to a first strobe for changing states for each occurrence at the first input circuit;
- a second bistable state circuit responsive to a second strobe for changing states for each occurrence at the second input circuit;
- exclusive OR gating means coupled to the first and second bistable state circuits for forming output representations;
- a third bistable state circuit having an output and responsive to a third strobe for changing to a state corresponding to the output representation of the exclusive OR gating means;
- gating means responsive to a fourth strobe and the third bistable state circuit for forming in an output signal an occurrence;
- further exclusive OR gating means having inputs coupled to the exclusive OR gating means and to the output signal from the gating means for applying the third strobe to the third bistable state circuit; and
- means operative during repetitive cycles for applying, during each cycle, the first, second and fourth strobes in a predetermined sequence.

14. A circuit for totalizing simultaneous and/or non simultaneous occurrences in input signals occurring at separate input circuits and for providing readout signals separated by a minimum time interval, comprising:
- a first two state circuit for assuming a different state in response to a strobe for each such occurrence in a first input signal;
- a second two state circuit for assuming a different state in response to a strobe for each such occurrence in a second input;
- a clock for alternately strobing said first and second two state circuits at differing times;
- means for alternately forming output indications representing binary "1" and "0" values, a different value of output indication being formed for each change in state of either one of said first and second two state circuits;
- a storage circuit operative, upon an applied strobe, for storing an indication of a binary value "1" for a binary value "1" output indication and for storing an indication for a binary value "0" for a binary value "0" output indication;
- means for reading out the stored indications of binary values "1" and "0" and comprising clocking means to enable the readout upon the occurrence of the strobe of both said first and second two state circuits; and
- means for applying a strobe to said storage circuit to enable the store therein upon the concurrence of opposite binary values in the output indication as compared with the stored indication that is last read out from the storage circuit.

15. An electrical totalizer for forming an output signal with random occurrences at a maximum rate of occurrence and representative of the total number of random occurrences separately applied at first and second input circuits thereof, comprising:
- means for sequentially and alternately scanning the first and second input circuits and for producing a series of output representations having a rate of occurrence of up to a maximum of a predetermined rate, an output representation being formed for each different occurrence applied at either of the first and second input circuits, each of the input circuits being so scanned at one half said predetermined rate;
- means for providing in an output signal a series of output occurrences occurring at a maximum of one half said predetermined rate, one output occurrence being provided for each of the output representations; and
- means for temporarily storing a representation of one of the output representations until an output occurrence has been formed for the output representation preceding such one of the output representations, the means for providing output signals being characterized for providing an output occurrence in the series corresponding to the temporarily stored representation thereby enabling output occurrences to be reliably formed corresponding to all applied random occurrences, the latter having a combined average rate of occurrence of up to one half said predetermined rate which applied occurrences may be applied at either of the first and second input circuits with an average rate of up to one half said predetermined rate.

* * * * *